United States Patent [19]

Jamal

[11] Patent Number: 5,568,437
[45] Date of Patent: Oct. 22, 1996

[54] BUILT-IN SELF TEST FOR INTEGRATED CIRCUITS HAVING READ/WRITE MEMORY

[75] Inventor: Kamran Jamal, Sunnyvale, Calif.

[73] Assignee: VLSI Technology, Inc., San Jose, Calif.

[21] Appl. No.: 493,204

[22] Filed: Jun. 20, 1995

[51] Int. Cl.⁶ .................................................. G11C 7/00
[52] U.S. Cl. .................... 365/201; 365/189.07; 371/21.1
[58] Field of Search ................................. 371/21.1, 21.2; 365/201, 189.07

[56] References Cited

U.S. PATENT DOCUMENTS

| | | | |
|---|---|---|---|
| 4,414,665 | 11/1983 | Kimura et al. | 365/201 |
| 5,062,109 | 10/1991 | Oshima et al. | 371/21.2 |
| 5,132,937 | 7/1992 | Tuda et al. | 365/201 |
| 5,278,839 | 1/1994 | Matsumoto et al. | 371/21.2 X |
| 5,327,363 | 7/1994 | Akiyama | 371/21.1 X |

OTHER PUBLICATIONS

Dekker, Rob et al., "Fault Modeling and Test Algorithm Development for Static Random Access Memories," 1988 International Test Conference, IEEE, pp. 343–352.

*Primary Examiner*—Son T. Dinh
*Attorney, Agent, or Firm*—Hickman Beyer & Weaver

[57] ABSTRACT

An integrated circuit with random access memory (RAM) and a built-in self tester for the RAM is disclosed. The built-in self tester includes a RAM BIST controller, a comparator, and a BIST I/O. The RAM BIST controller controls the RAM during a test where the RAM includes data, address, and control lines. The comparator is responsive to outputs of the RAM BIST controller and the RAM and develops an error signal. The BIST I/O is responsive to outputs of the comparator and has an output coupled to one of the I/O ports. The BIST I/O is further capable of storing an address of a data storage location in the RAM that malfunctions during the test and outputting the address via an integrated circuit I/O port.

22 Claims, 12 Drawing Sheets

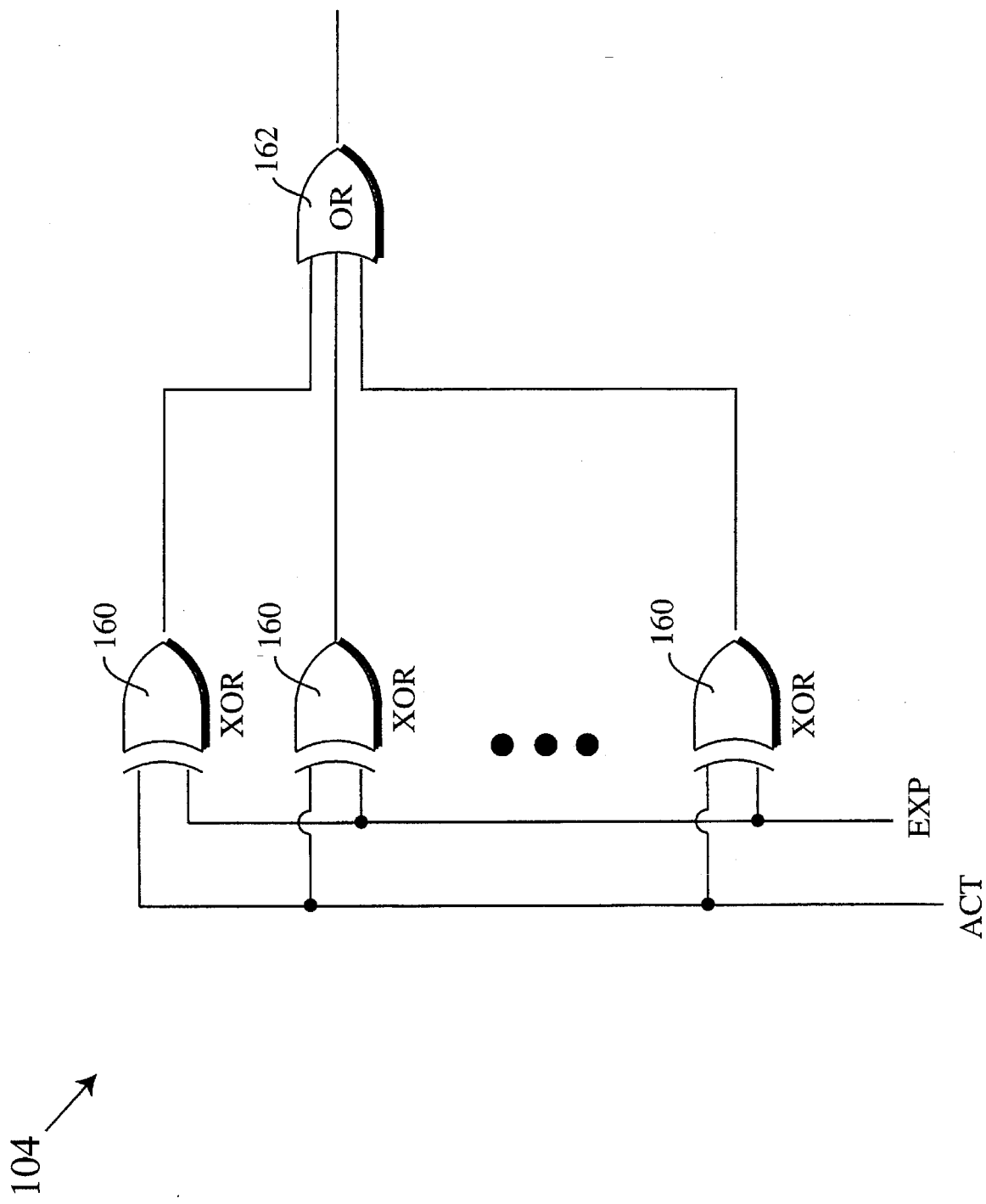

BUILT-IN SELF TEST FOR INTEGRATED CIRCUITS HAVING READ/WRITE MEMORY

BACKGROUND OF THE INVENTION

This invention relates generally to integrated circuits and more particularly to self test circuitry for integrated circuit memory.

Over the past several decades, integrated circuits (ICs) have become an integral part of many devices and machines. Because of the crucial role of ICs in such devices and machines, it is often desirable to test integrated circuits after their construction. Random Access Memory (RAM), Read-Only Memory (ROM), and multipliers are common test targets, but they may be deeply embedded within the IC logic, making them difficult to access for test purposes.

Multiplexer or "functional block" isolation is one approach to testing these subcircuits. In this technique, multiplexers provide paths from IC input/output (I/O) pads to the targeted subcircuit. Externally generated test enable signals switch the multiplexers into test mode. Functional block isolation suffer from several disadvantages, however, including multiplexer delays, routing congestion, and the need for externally generated test vectors or signals. Also, given a limited number of I/O pads, designing a multiplexer configuration to test all the targeted embedded subcircuits may be difficult.

Alternatively, built-in self test (BIST) circuitry may be fabricated on the integrated circuit itself. BIST logic generates input test patterns for the RAMs, ROMs, or multipliers. The output data from these subcircuits can either be compared with the expected data from the BIST directly or compacted in a signature register. The comparison result is stored in a register and then shifted out of the IC to an external measurement device. In this way, the external measurement device only detects whether a logic fault was found and does not perform signal comparisons.

A conventional integrated circuit 10 having built-in self test (BIST) capability is illustrated in FIG. 1a. A built-in self tester 12 is coupled to a random access memory (RAM) 14 through address, data, and control lines. Other components 16 will generally be pan of the integrated circuit 10, but they are not the primary focus of the present discussion.

The BIST 12 receives test clock and test mode select signals generated externally to the integrated Circuit 10. The test clock signal clocks the BIST circuitry 12 and testing operations performed by the BIST on the RAM 14. The test mode select signal specifies the type of test performed by the BIST 12. For example, the BIST 12 may operate in flag mode to output an error flag, scan mode to scan out signature register contents, or signature mode to output the retrieved data in parallel to an external testing device.

Upon reception of the test clock and test mode select signals, the BIST 12 generates its own testing pattern vectors as test data for the RAM 14. Optionally, the IC 10 may have a BIST reset pin to reset registers in the BIST 12. The test vectors are then written to and retrieved from the RAM 14 over the data line in conjunction with address and control Signals sent over the address and control lines. The retrieved data is compared With expected data by the BIST 12, and a test result may then be output through an I/O pin to external devices. When BIST testing is complete and end of test signal is output to an IC pin.

Another conventional integrated circuit 20 with BIST capability is illustrated in FIG. 1b. Again, a BIST 22 tests a RAM 14 over address, data, and control lines. Other components 16 will generally also be on the integrated circuit 20. The particular configuration shown in FIG. 1b is for a BIST synthesized in flag or compare mode. As in FIG. 1a, the BIST 22 has test clock and test mode signals as inputs. However, test access port (TAP) circuitry 28 now interfaces the BIST 22 with the integrated circuit input/output pins. Within the industry, TAP denotes the IEEE 1149.1 input/output test convention. The standard dictates four pins: test data input (TDI), test data output (TDO), test mode select (TMS), and test clock (TCK). An optional test reset (TRST) pin is also provided by the TAP standard.

Another conventional integrated circuit 30 with BIST circuitry 32 synthesized in signature mode is illustrated in FIG. 1c. As in FIG. 1b, integrated circuit 30 also has a TAP interface 38 with the same IC pin correspondences as in FIG. 1b. The TAP 38 prepares the BIST 32 for testing by transmitting a scan mode signal. For example, if a IEEE 1149.1 TAP controller is present, it can be used to generate all the control signals (e.g. test mode, test clock) for the BIST and output signals from the BIST (e.g. end of test, test result). The output signals from the BIST are externally available through the TAP.

SUMMARY OF THE INVENTION

The present invention is an integrated circuit with read/write memory and an improved read/write memory self testing capability. Briefly, the integrated circuit includes a read/write (e.g. RAM) memory, a controller, a comparator, and input/output circuitry. The read/write memory has data storage locations, and each location has a unique address. The controller is responsive to a test enable signal and is operative to generate test data and store the test data at various locations in the read/write memory. The comparator is responsive to the test data provided by the controller and to data retrieved from the read/write memory. The comparator compares the test data and the retrieved data for corresponding locations in the read/write memory. The comparator produces error signals indicating whether the retrieved data does not correspond correctly to the test data. The input/output circuitry includes a register capable of storing address, data, and control signal information of a read/write memory location where an error has been detected as indicated by the error signals. The input/output circuitry is further capable of outputting the address, data, and control signal information to provide an indication of where the error occurred in the read/write memory.

An integrated circuit with random access memory (RAM) and a built-in self tester is also disclosed. The RAM has data storage locations with each location having a unique address. The built-in self tester (BIST) is coupled to the RAM and to input/output (I/O) ports of the integrated circuit and includes a RAM BIST controller, a comparator, and a BIST I/O. The RAM BIST controller controls the RAM during a test where the RAM includes data, address, and control lines. The comparator is responsive to outputs of the RAM BIST controller and the RAM and develops an error signal. The BIST I/O is responsive to outputs of the comparator and has an output coupled to one of the I/O ports. The BIST I/O is further capable of storing address, data, and control information of a data storage location in the RAM that malfunctions during the test. The BIST I/O is also capable of outputting the address, data, and control signal information via the I/O port.

A method of testing memory on an integrated circuit is also disclosed. The method includes activating a read/write memory location on the integrated circuit and activating a built-in self tester (BIST) on the integrated circuit. The BIST writes test data to the memory location and reads the test data as retrieved data from the same memory location. The method then compares the test data with the retrieved data and develops an error signal when the retrieved data does not correctly correspond to the test data. In an error register, the BIST stores address, data, and control information of the memory location in response to the error signal. Subsequently, the BIST outputs contents of the error register in response to an output command received by the BIST.

An advantage of the present invention is the circuitry of the present invention provides the address, data, and control information concerning the memory location producing the error. The invention therefore permits easier and more efficient embedded RAM testing.

These and other advantages of the present invention will become apparent upon reading the following detailed descriptions and studying the various figures of the drawings.

BRIEF DESCRIPTION OF DRAWINGS

FIG. 6 is an embodiment of the comparator shown as part of the BIST circuitry in FIG. 3.

DETAILED DESCRIPTION OF THE PREFERRED EMBODIMENTS

Figure 1A:
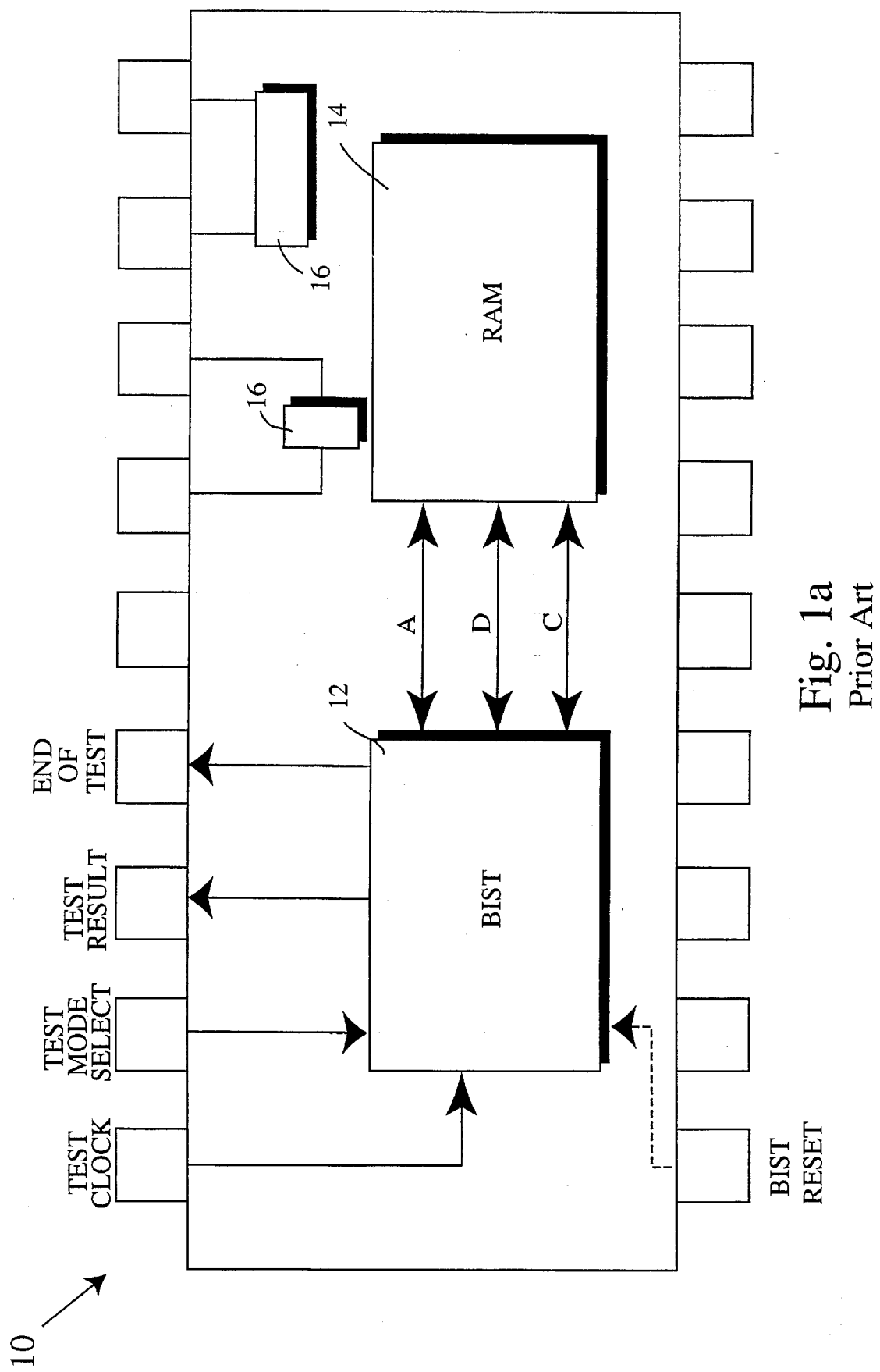
FIG. 1a is a schematic diagram of a prior art integrated circuit including BIST circuitry and RAM.
Figure 1B:
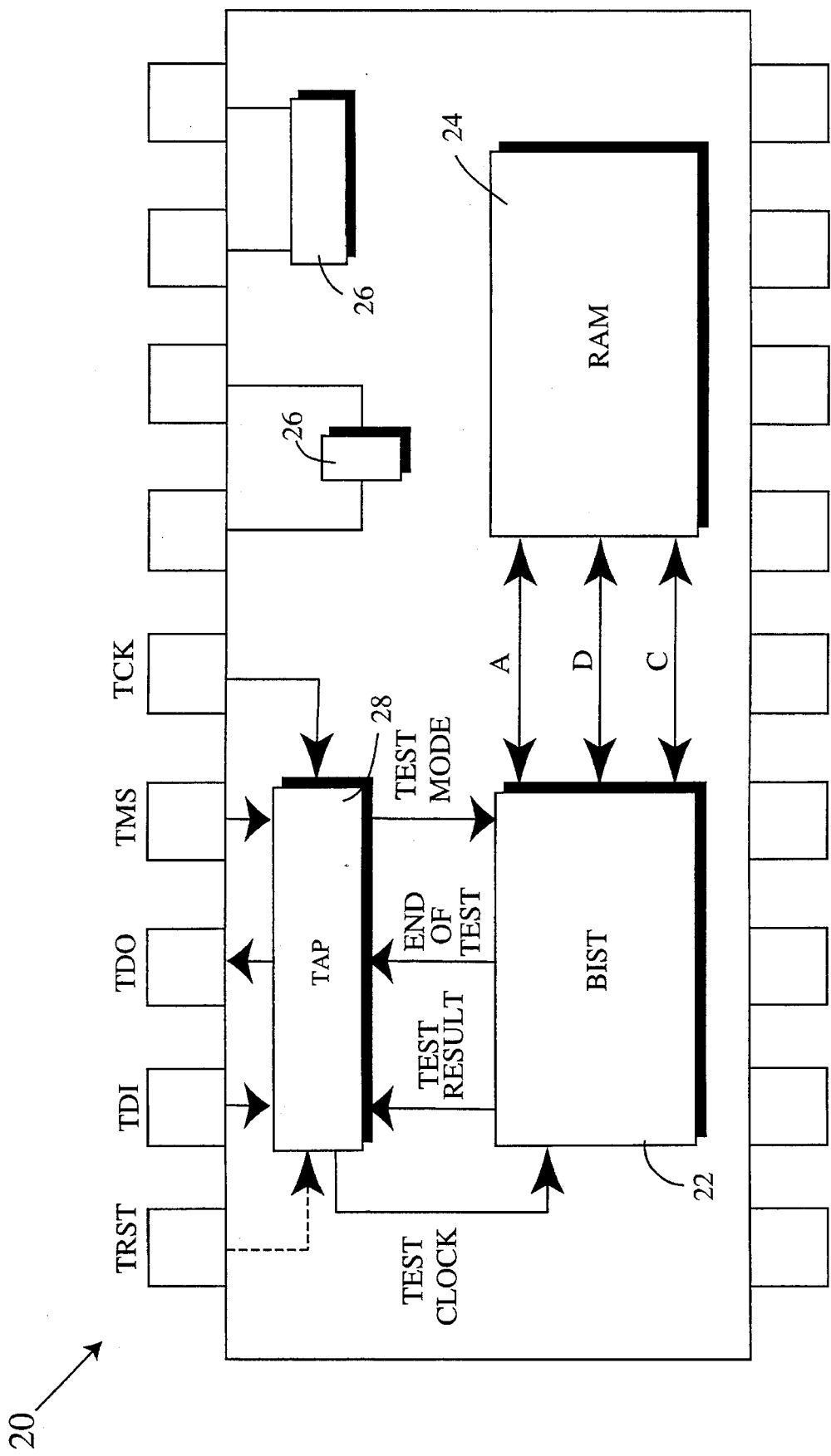
FIG. 1b is a schematic diagram of a prior art integrated circuit including BIST circuitry and RAM using a standard testing input/output convention.
Figure 1C:
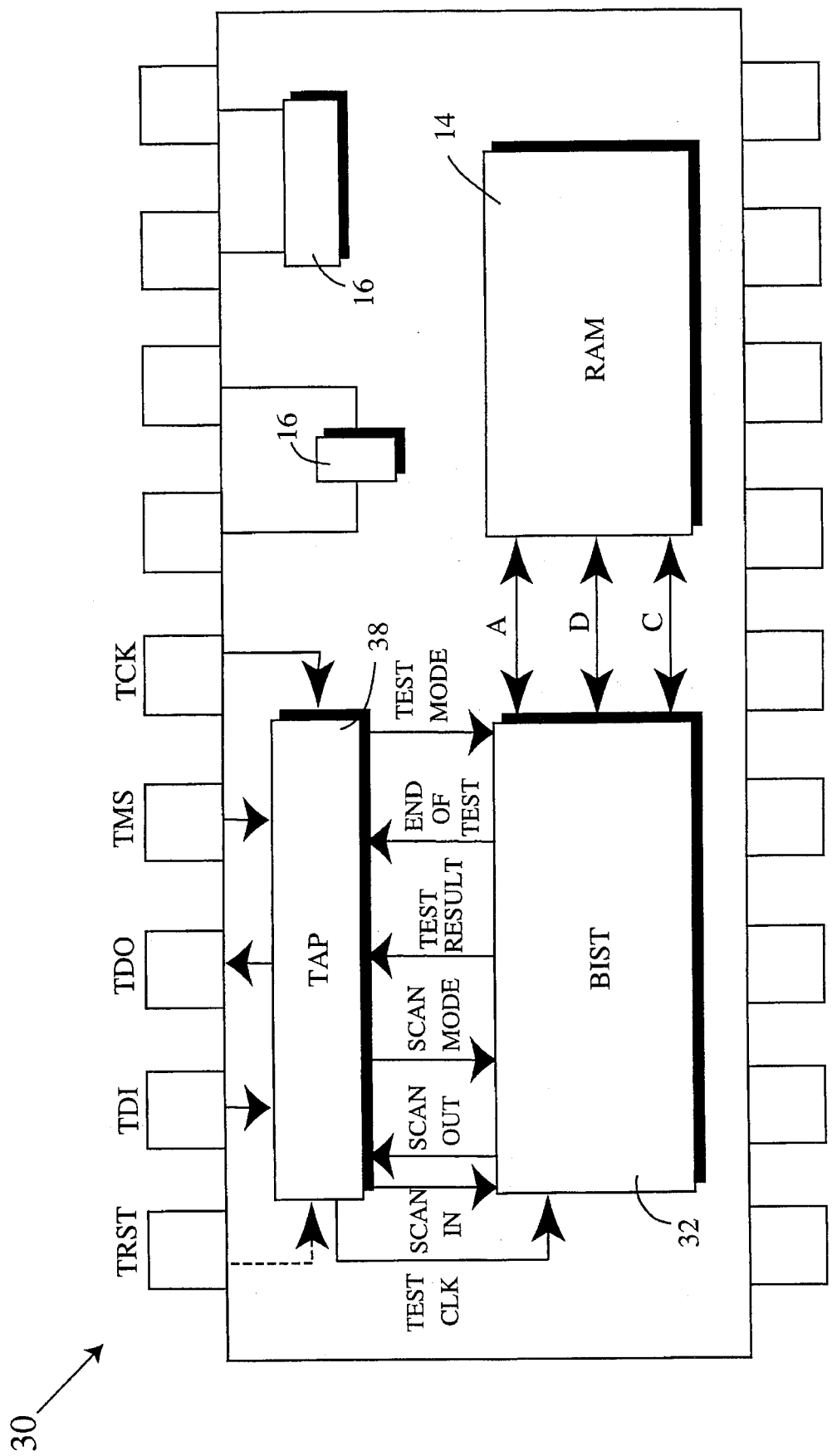
FIG. 1c is a schematic diagram of a prior art integrated circuit including BIST circuitry and RAM using a standard testing input/output convention.
Figure 2A:
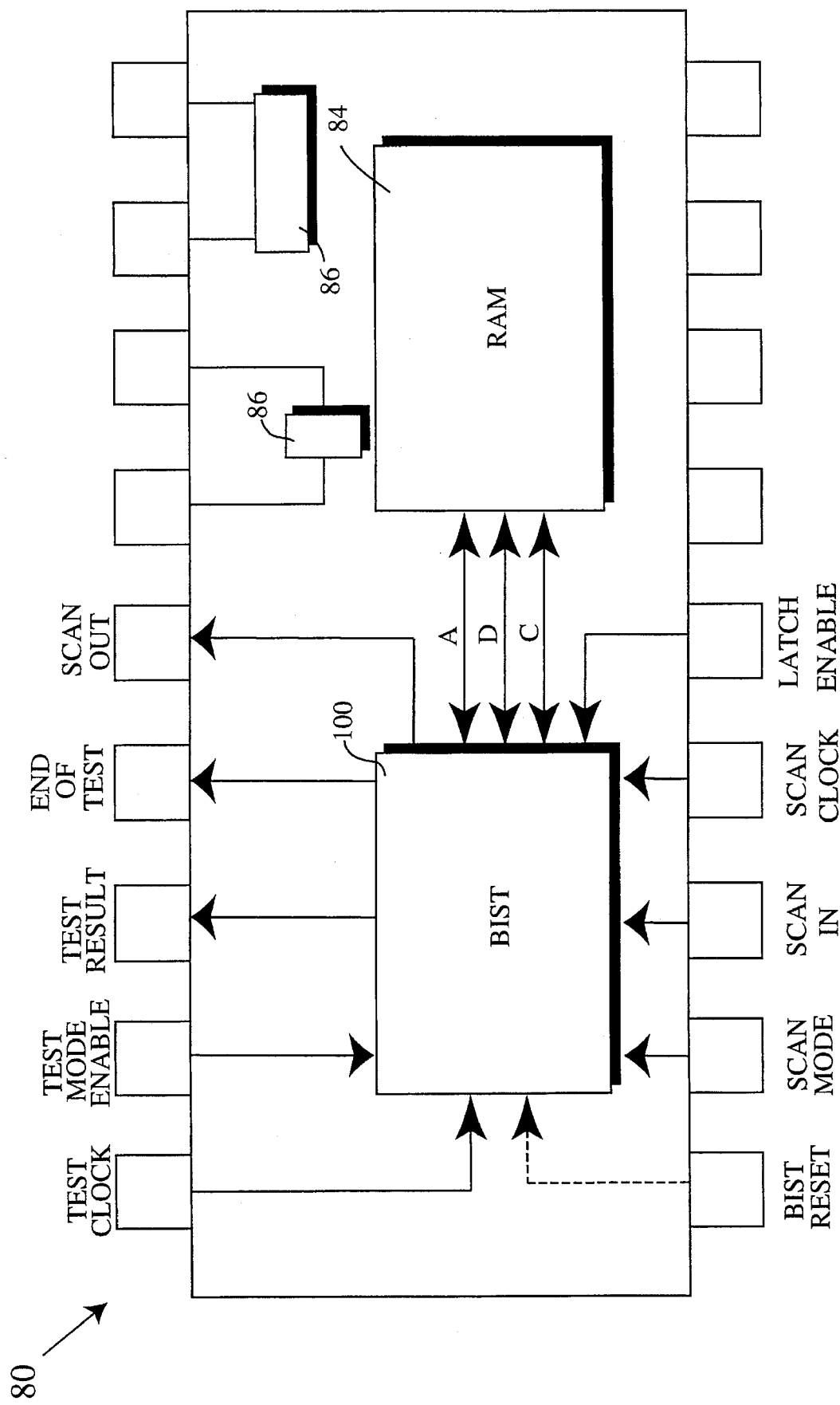
FIG. 2a is a schematic diagram of an embodiment of an integrated circuit including BIST circuitry in accordance with the present invention.

FIGS. 1a–1c were described previously with reference to the prior art. FIG. 2a illustrates an integrated circuit 80 having built-in self test capability in accordance with an embodiment of the present invention.

With reference to FIG. 2a, a built-in self tester (BIST) 100 receives a "test clock" signal from an integrated circuit I/O pin. The BIST 100 also receives a "scan mode" (enable) signal from an external source to initialize an error counter register within the BIST 100. A separate "test mode" enable signal may initialize BIST controller registers and prepare the controller for testing. Optionally, a "BIST reset" indicated by the dashed lines in FIG. 2a clears both error registers and controller registers. Upon receipt of the scan mode enable signal, the BIST can receive initialization data through a "scan in" line, or the BIST can be pre-initialized with predetermined values. A "scan clock" line produces a clocking signal for the scan in or shift in operation.

The BIST 100 tests a RAM 84 by writing to specified addresses in the RAM through a data line. The address where test data is written in the RAM 84 is sent to the RAM over an address line, and control signals to the RAM 84 are sent from the BIST 100 through control lines. BIST 100 writes test data to the RAM 84, retrieves data stored in the RAM, :and compares the test data with the retrieved data. Generally, other components 86 may reside on the integrated circuit 80, but they are not the primary focus of the present discussion.

If the retrieved data does not correctly correspond with the test data, an error signal is produced. The error signal is used within the BIST 100 and made available to an external pin via the "test result" line. When an error is detected, address, data, and control information is recorded in an error register in BIST 100, and an error counter is incremented in the error register. In other words, the error register is, in this preferred embodiment, one, long shift registers having portions corresponding to the address, data, control, and counter information.

A latch enable signal commands a BIST register to latch the address of the malfunctioning location in the RAM 84. In addition, data sent to or received from the RAM 84 during the malfunction may be recorded in a register in the BIST 100. Likewise, control information produced by the BIST controller in the BIST circuitry 100 at or about the time of writing data to the RAM, reading data from the RAM, or comparing test data written with retrieved data may also be recording in a control registers BIST 100 under control of the latch enable command.

Writing test data to memory, retrieving data, and latching information may be repeated if desired. Upon completion of BIST testing, an "end of test" signal is produced and made available to an integrated circuit I/O pin, and BIST registers are scanned out to a "scan out" I/O pin under the command of the shift or scan clock.

Although the inputs to and outputs from the BIST circuitry 100 have just been described as connected to separate I/O pins on the integrated circuit 80, this is not the only embodiment of the invention. Multiple signals may be carried on the same line. Some or all of the signals connected to the BIST 100 may be internally generated on the integrated circuit 80. As will become apparent below, the precise signals used to test memory made be replaced by comparable signals. However, it will be convenient for illustration to focus on the BIST input/output signal arrangement shown in FIG. 2a.

Figure 2B:
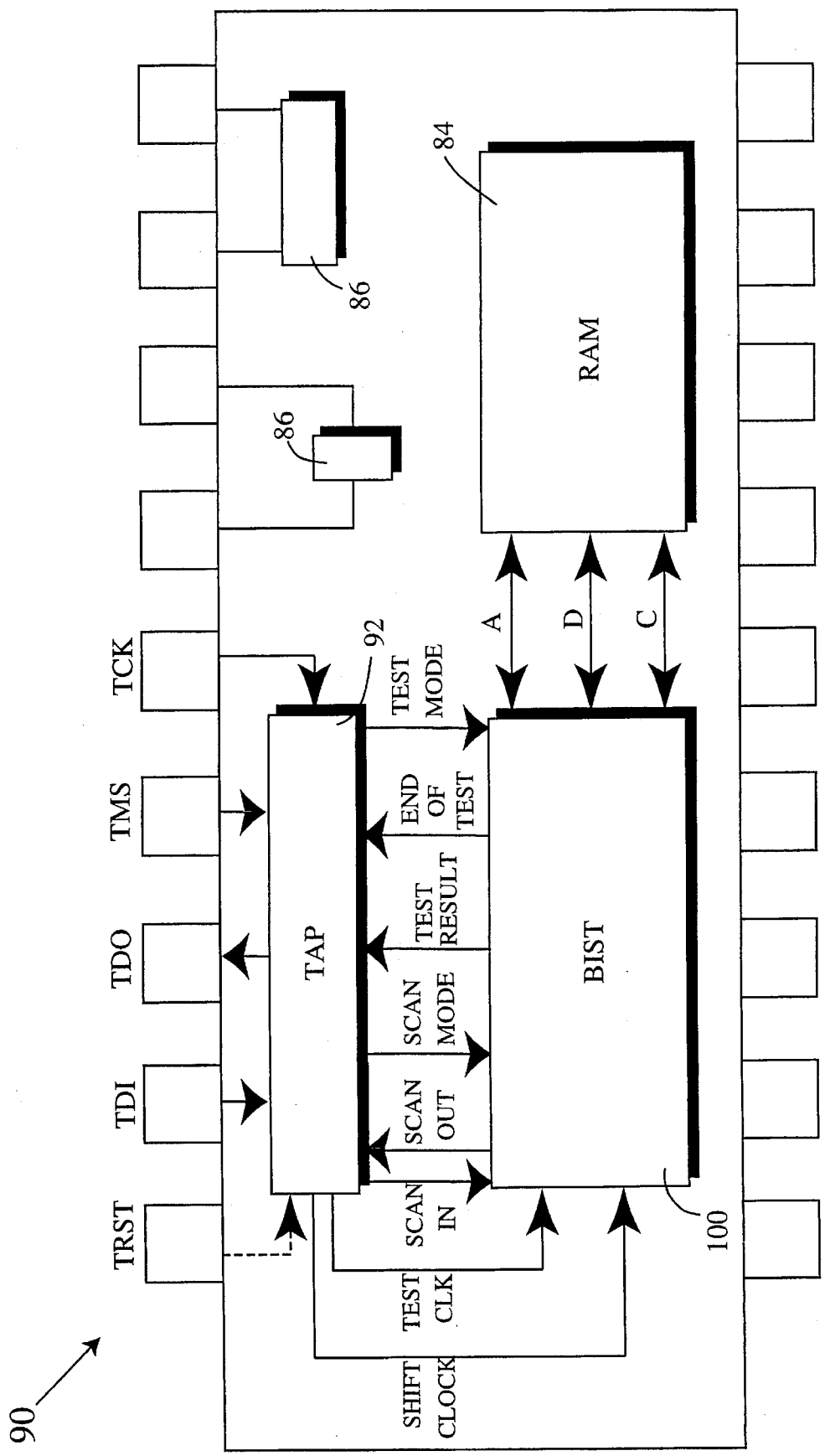
FIG. 2b is a schematic diagram of an embodiment of an integrated circuit including BIST circuitry with an input/output interface in accordance with the present invention.

FIG. 2b illustrates another integrated circuit 90 having BIST capability in accordance with the present invention where some of the BIST inputs and outputs are not directly connected to integrated circuit I/O pins. In this embodiment, the BIST 100 is used in conjunction with a TAP interface 92. The I/O pins have the standard TAP assignments discussed previously. The inputs and outputs to the BIST 100 in FIG. 2a are now routed through the TAP circuitry 92. In other words, the BIST 100 receives test clock, shift clock, scan mode enable, test mode enable, and scan in signals from the TAP interface 92. The BIST 100 also outputs end of test, test result, and scan out signals to the TAP 92.

Figure 3:
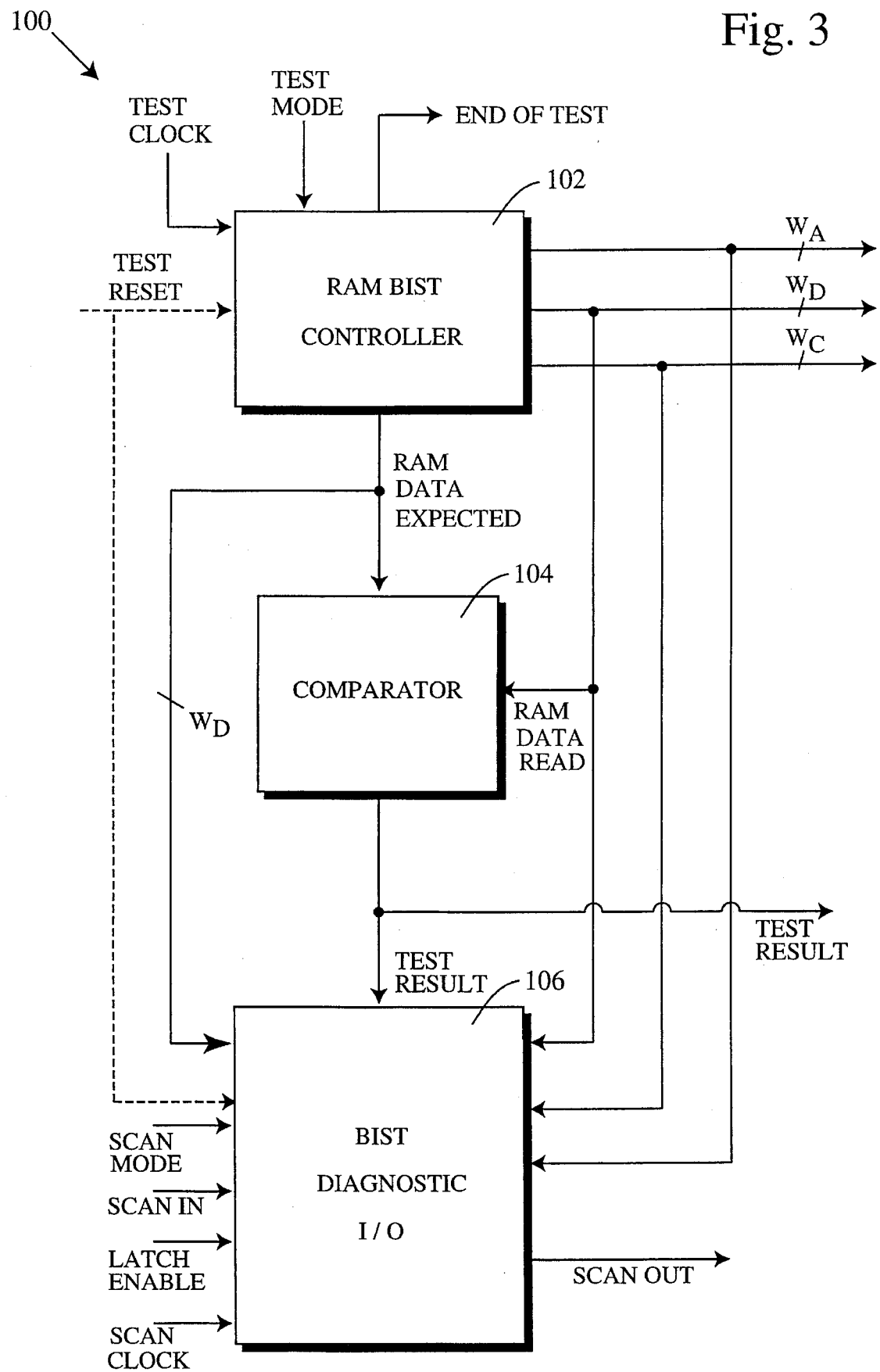
FIG. 3 is a schematic diagram of an embodiment of BIST circuitry with diagnostic I/O made in accordance with the present invention.

A built-in self tester 100 for use in an integrated circuit made in accordance with the present invention will now be described in detail with reference to FIG. 3. A test mode or test enable signal is received by a RAM BIST controller 102 initializes registers within the RAM BIST controller 102 at the beginning of RAM testing. Optionally, a test reset signal may be received by the RAM BIST controller 102 from an input/output pin. The test reset signal would generically clear registers within the RAM BIST controller 102 and other registers within the BIST 100.

The RAM BIST controller 102 generates test data for the RAM 84 and transmits it over the data bus of width $W_D$. The controller 102 also transmits control signals to the RAM over control line of width $W_C$ to addresses within the RAM. The addresses are specified by the RAM BIST controller 102 and transmitted to the RAM 84 over the address line of $W_A$. The data transmitted over the data line will be written to the addresses sent over the address line. The controller 102 will also send the test data to a comparator 104.

After writing the test data to specified addresses within the RAM (84), the controller 102 will send control signals to the RAM 84 to retrieve the test data which was stored at the addresses. The retrieved data is sent over the data line and to the comparator 104 where it is compared with the expected data received from the BIST controller 102. A test result or pass/fail signal is sent from the comparator to both a BIST diagnostic I/O circuitry 106 and optionally to an integrated circuit I/O pin (e.g. as in FIG. 2a).

The BIST I/O 106 is initialized with a scan mode signal which permits scanning in of initial data. Alternatively, the BIST I/O 106 may be initialized by the optional test reset signal which also initializes the RAM BIST controller 102 as described above. The scanning in of initial data is clocked by the scan clock.

Upon testing the RAM (84), the comparator 104 may be produce an error signal or test result signal which is transmitted to the BIST I/O 106. When the BIST I/O 106 detects the error signal from the comparator 104, the error signal will be latched in a register in the BIST I/O 106 under control of a latch enable signal.

The latch enable signal may be external to the BIST 100 or internally generated whenever an error occurs. In addition, the address in RAM 84 where the retrieved data failed to correctly correspond to the expected data will be latched into an address register within the BIST I/O 106. Optionally, the BIST I/O 106 will also latch the data retrieved from or sent to the malfunctioning address and the controls given to the RAM approximately when the error occurred or was detected. The registers containing the error signal, the address, the data, and the control information may form a scan chain which can be scanned out to an output pin on the I/C or circuitry on the IC. The scan out operation may be performed for each error detected or it may be postponed until all testing is completed. The latter option may only scan out address, data, or control information for a selected error amongst all the errors detected such as the last error detected.

During normal mode, the RAM 84 may be connected to other system signals through the BIST 100. In other words, BIST circuitry 100 interfaces the RAM 84 to other components on the integrated circuit die. System signals containing control, address, and data information may be transmitted through the BIST circuitry 100 to the RAM 84 during normal operation. Control (C), address (A), data input ($D_I$), and data output ($D_O$) lines connect the BIST circuit 100 with the RAM circuit 84.

The BIST circuitry 100 switches to test mode upon receipt of a "test mode" or "test enable" signal along with a test clock signal. Then, the BIST controller 102 creates test input data $D_I$ to test the RAM 84. The input test data $D_I$ is generated by the BIST 100 itself and is not received from external circuitry via an I/O port or from other subcircuits on the integrated circuit 80 or 90.

Figure 4:
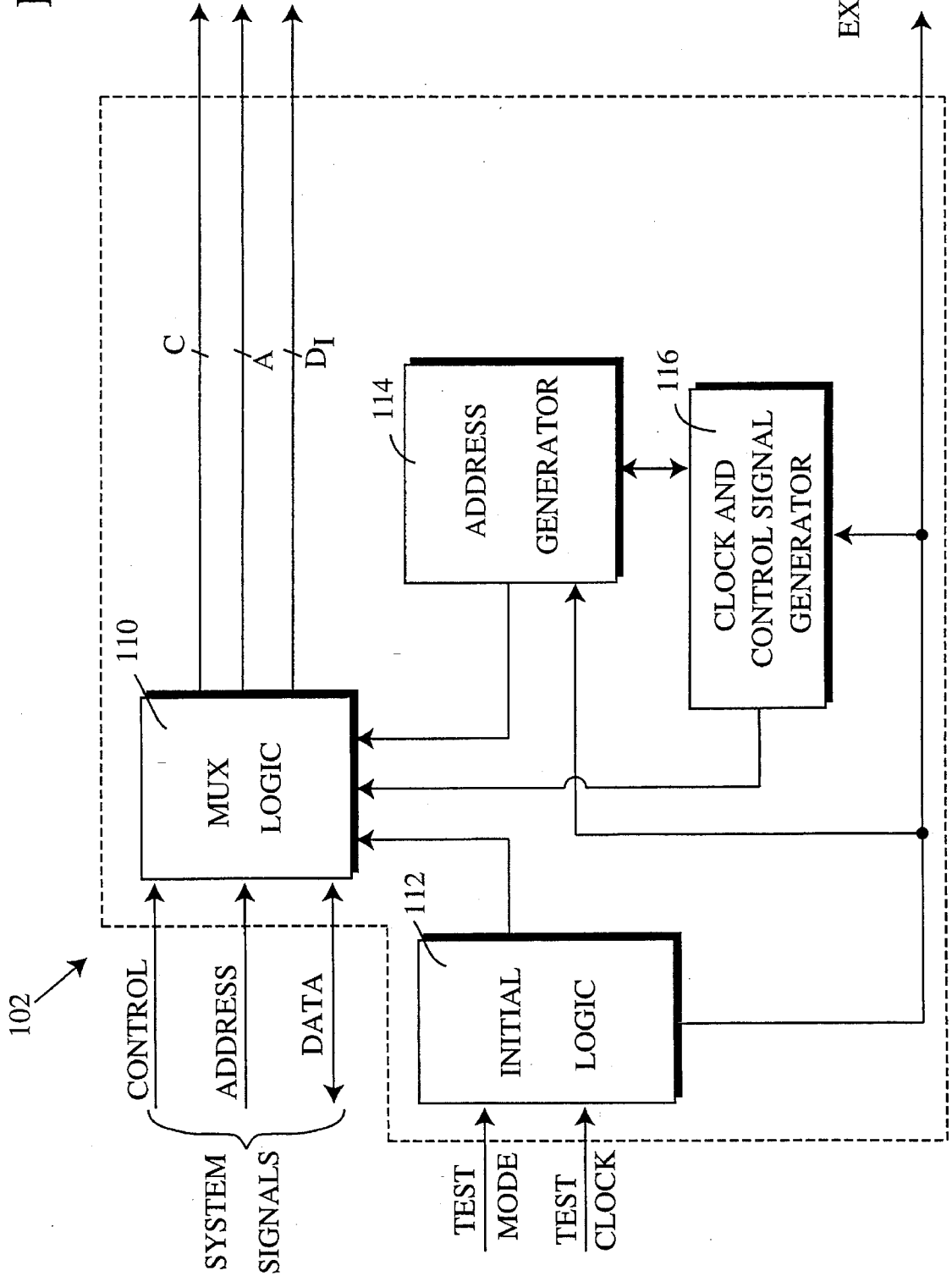
FIG. 4 is a schematic block diagram of an embodiment of the RAM BIST controller shown in FIG. 3.

FIG. 4 is a block diagram showing the architecture of the BIST controller 102 in greater detail. As in FIG. 3, control (C), address (A), data input ($D_I$), and data output (DO) lines connect the BIST circuit 100 with the RAM circuit 84. In "normal" or "functional" mode, the BIST controller 102 permits a transparent interaction between other components of the integrated circuit 80, 90 and the RAM 84 through the multiplexer logic 110. The multiplexer 110 is synthesized in effect to detach the BIST circuit 100 from the RAM 84 during normal mode.

A test mode signal applied to initialization logic 112 activates the BIST 100. For proper operation, the BIST 100 requires an initialization. The initialization logic 112 commands the multiplexer 110 to decouple the RAM from the other components of the integrated circuit die and couples the BIST 100 to the RAM. The logic 112 also activates an: address generator 114 and a clock and control signal generator 116. Initialization logic 112 requires two test clock cycles for the internal initialization corresponding to one cycle with test mode enable "low" or "not active" and a second cycle with the test mode "high" or "active." Alternatively, an external initialization signal may be applied.

The clock and control signal generator 116 is the heart of the BIST controller 102. It generates internal clock signals, address direction signals, read/write enable signals, test patterns, and an end-of-test signal for the RAM 84. Rather than relying upon externally generated test patterns, the clock and control signal generator 116 generates the BIST test patterns and transfers them to the RAM 84 undergoing test through the multiplexer logic 110. Test mode and test clock signals are the inputs to the clock and control signal generator 116 and are received by the initialization logic 112.

The address generator 114 generates RAM 84 addresses from 0 to the maximum significant bit (MSB) and from MSB to 0. It also monitors the number of memory scans performed by the BIST 100. Since most embedded RAMs have address spaces which are not a power of two, the address generator will generally be capable of handling memory sizes that are not a power of two.

Figure 5A:
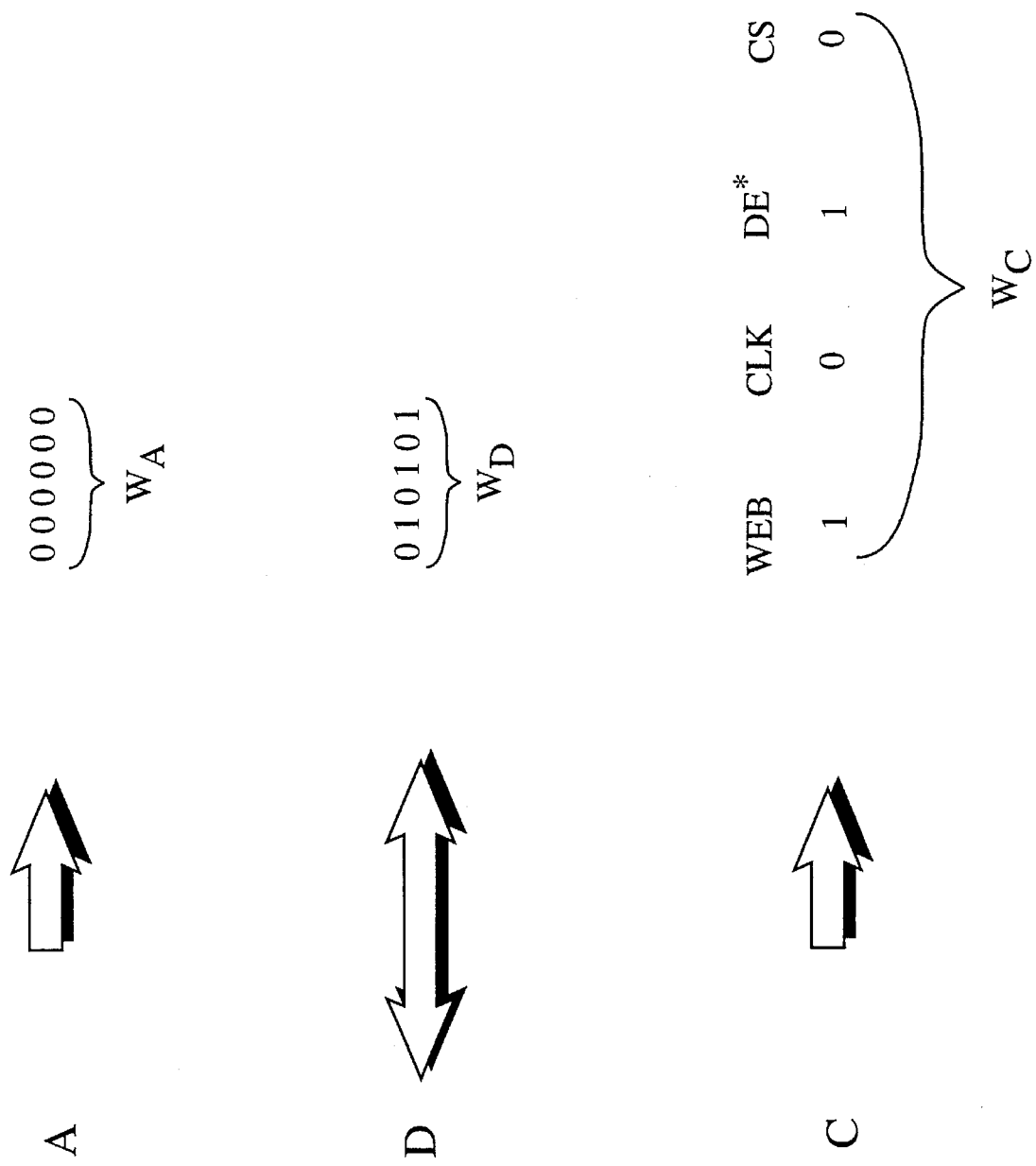
FIG. 5a illustrates signals sent to and from memory during an embodiment of the memory testing method of the present invention.

FIG. 5a illustrates sample address, data, and control signals sent over the address, data, and control lines between the RAM BIST controller 102 and the RAM 84. An address sent to the RAM 84 could be 000000 with a width of 6 bits for $W_A$. Sample testing data such as 010101 may be written to the RAM 84. This value will be stored at an address in the RAM 84 and subsequently retrieved from that address. If the retrieved data correctly corresponds to the data written, the RAM 84 address will pass the test. However, if there is a discrepancy or malfunction, the comparator will produce an error signal. Although FIG. 5a illustrates the address with $W_A$ equaling the data width $W_D$, this is not a requirement.

Sample control information of width $W_C$ is also illustrated in FIG. 5a. The control information may contain, for example, a write enable signal (WEB), a clock signal (CLK), a device enable signal (DE*), and other control signals (CS). Of course, $W_C$ is not constrained to be 4 bits long or equal to $W_A$ and $W_D$. The address, data, and control signals illustrated in FIG. 5a will be latched in the BIST 106 when an error signal is produced by the comparator 104.

Figure 5B:
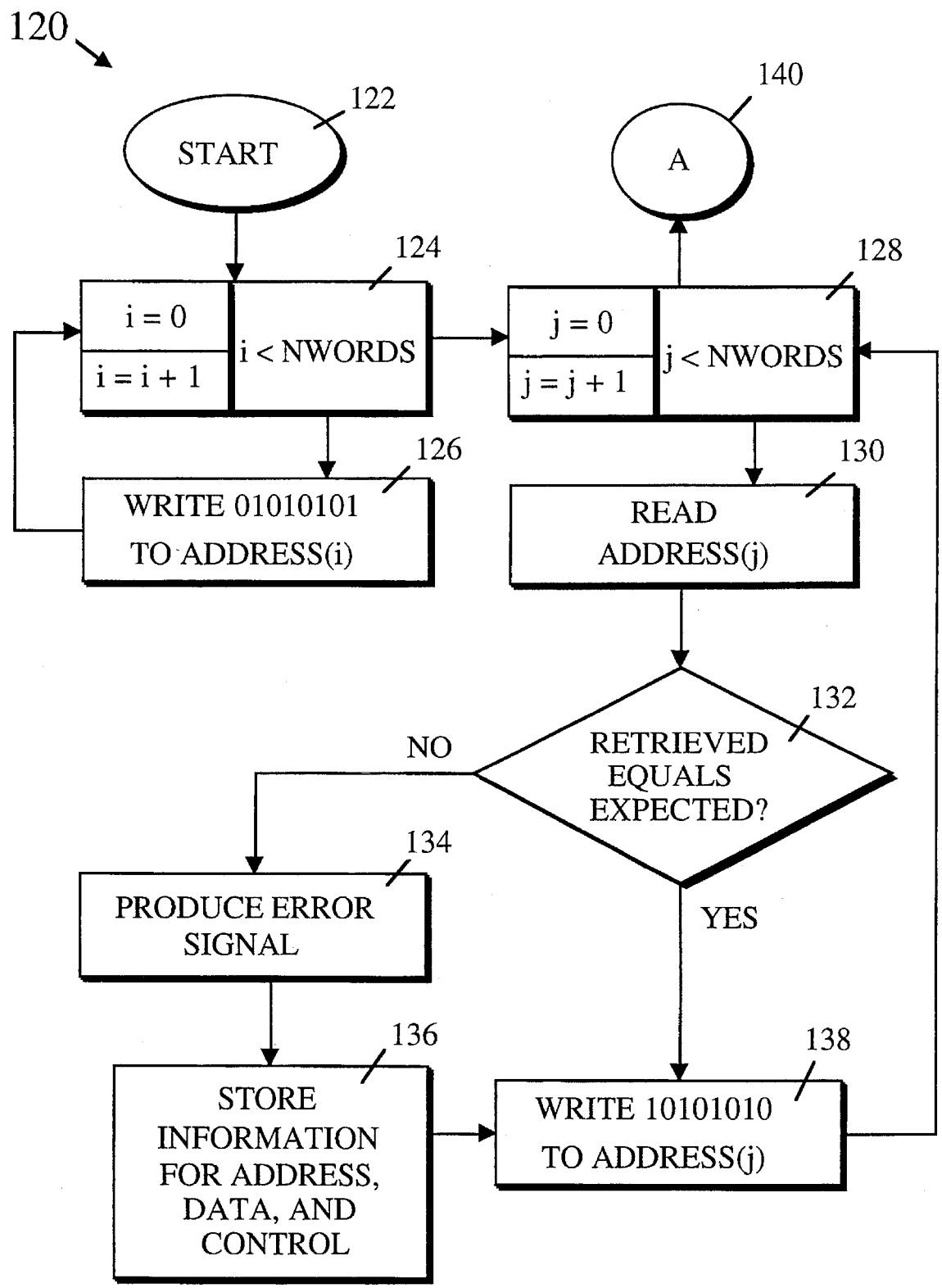
FIG. 5b is a the first part of a flowchart illustrating a method for testing memory in accordance with the present invention.

FIG. 5b illustrates a method 120 for testing memory on an integrated circuit beginning at a step 122. Initially, at least one address or read/write memory location is activated on an integrated circuit, and a built-in self tester is also activated. An iteration 124 is then performed over the number of words NWORDS. Test data, such as 010101, is then written in step 126 to a selected address. The iteration 124 continues until the maximum number of words NWORDS is reached. A second iteration 128 is then performed to read, in a step 130, the test data stored in step 126. The retrieved data is compared with the test data in step 132.

If the retrieved data does not equal to the expected test data, the comparator 104 produces an error signal in step 134 and sends it to the BIST I/O 106. The BIST I/O 106 then stores information related to the ADDRESS(j) in step 136. This information contains the ADDRESS(j) and optionally the expected data or the retrieved data. The information may also the control signals sent to the RAM 84 or received from the RAM 84 when the error occurred.

Whether or not the expected data equals the retrieved data, additional test data, such as the complementary bite 101010 is written to the selected address in step 138. The iteration 128 then continues in steps 130–138 are repeated until the iteration variable j reaches NWORDS.

Figure 5C:
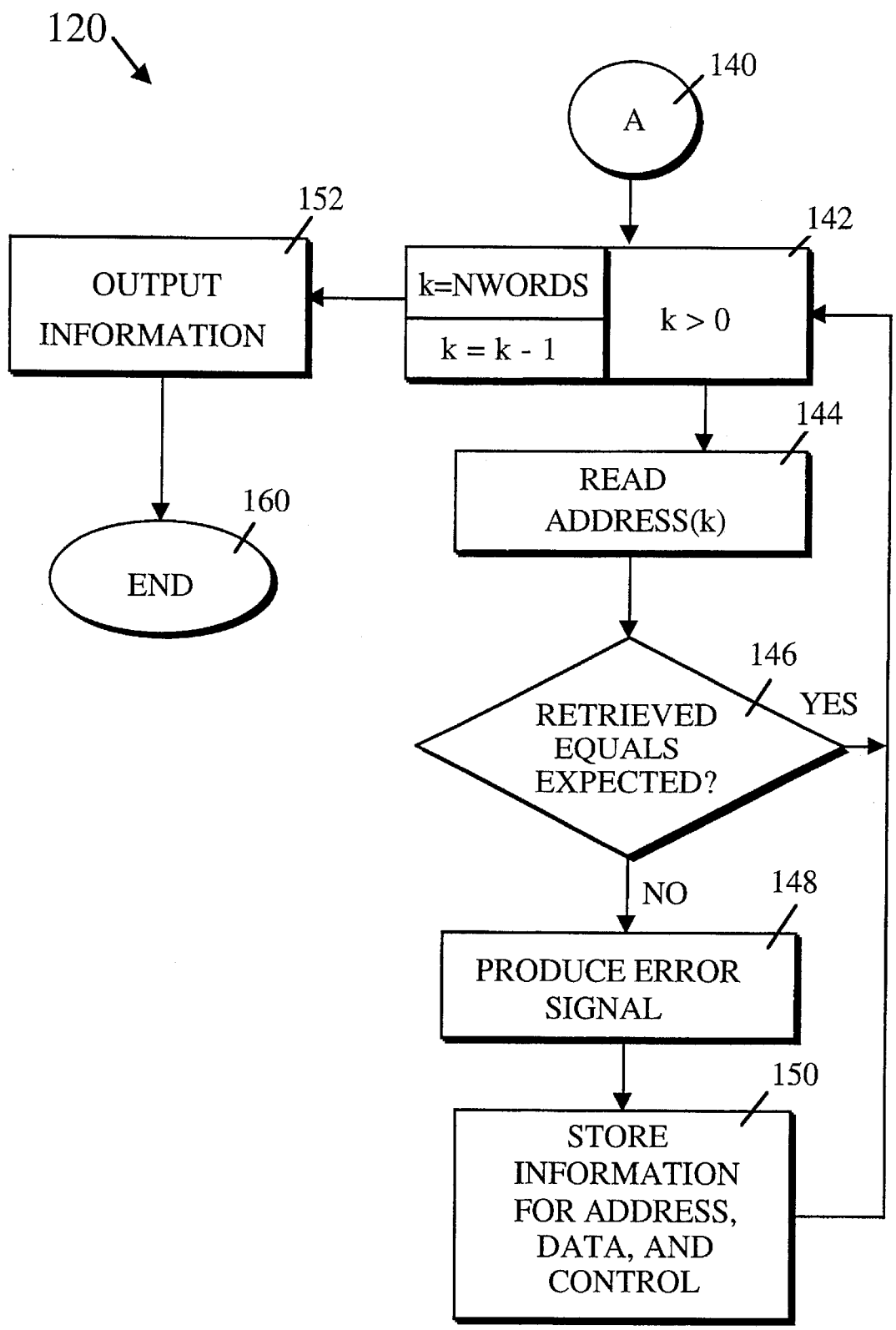
FIG. 5c is a continuation of the flowchart in FIG. 5b.

Upon completion of the iteration 128, the process 120 continues at 140 (see FIG. 5c). Using a descending iteration 142, the new test data written in step 138 is read in a step 144. Step 146 determines whether the data read in step 144 correctly correspond to the data written in step 138. If the correspondence in not correct, step 148 produces an error signal to command the BIST I/O to store address (k) in a step 150. The address (k) is stored in an error register in response to the error signal. The method 120 then proceeds either from step 146 or step 150 to the iteration 142. Steps 144–150 then repeat until k equals 0. Then, part or all of the information stored in steps 136 and 150 are output in step 152. Preferably, step 152 will output its information in response to an output command received by the BIST 100.

If desired, step 152 may only output information for the last error occurrence. Optionally, retrieved data stored in an error data register control data stored in an error control register, and contents of an error counter register may be output in step 152. This information may be for the last error which occurred or for may be for any selected error which occurred during testing. Preferably, the contents of the registers may be scanned out in a scan chain as described with reference to FIG. 2a.

Those skilled in the art will appreciate that comparing the retrieved data with the written test data involves determining a correct correspondence between the test data and the retrieved data. It is potentially quite complicated to compare each and every bit of the test data with the retrieved data. Therefore, various comparison techniques such as compaction and other signature comparison methods may be used in steps 132 and 146 to determine the correct correspondence between the test data and the retrieved data. However, in the present preferred embodiment, each and every bit of the test data will be compared with the retrieved data.

FIG. 6 shows a comparator 104 which makes a direct bit by bit comparison. The comparator shown in comparator 104 contains combinational logic to compare data stored in a selected storage location in RAM 84 with data that was written to the selected storage location. XOR gates 160 each compare a bit of retrieved data with a bit of expected test data. Outputs of the XOR gates 160 are inputs to a OR gate 162 which produces an error signal if any of the inputs to 162 are true. If all of the XOR gates 160 have agreeing retrieved XOR expected bits, all of the inputs to the OR gate 162 will be false. The OR gate 162 will then output a false signal indicating that no error has been detected.

Figure 7:
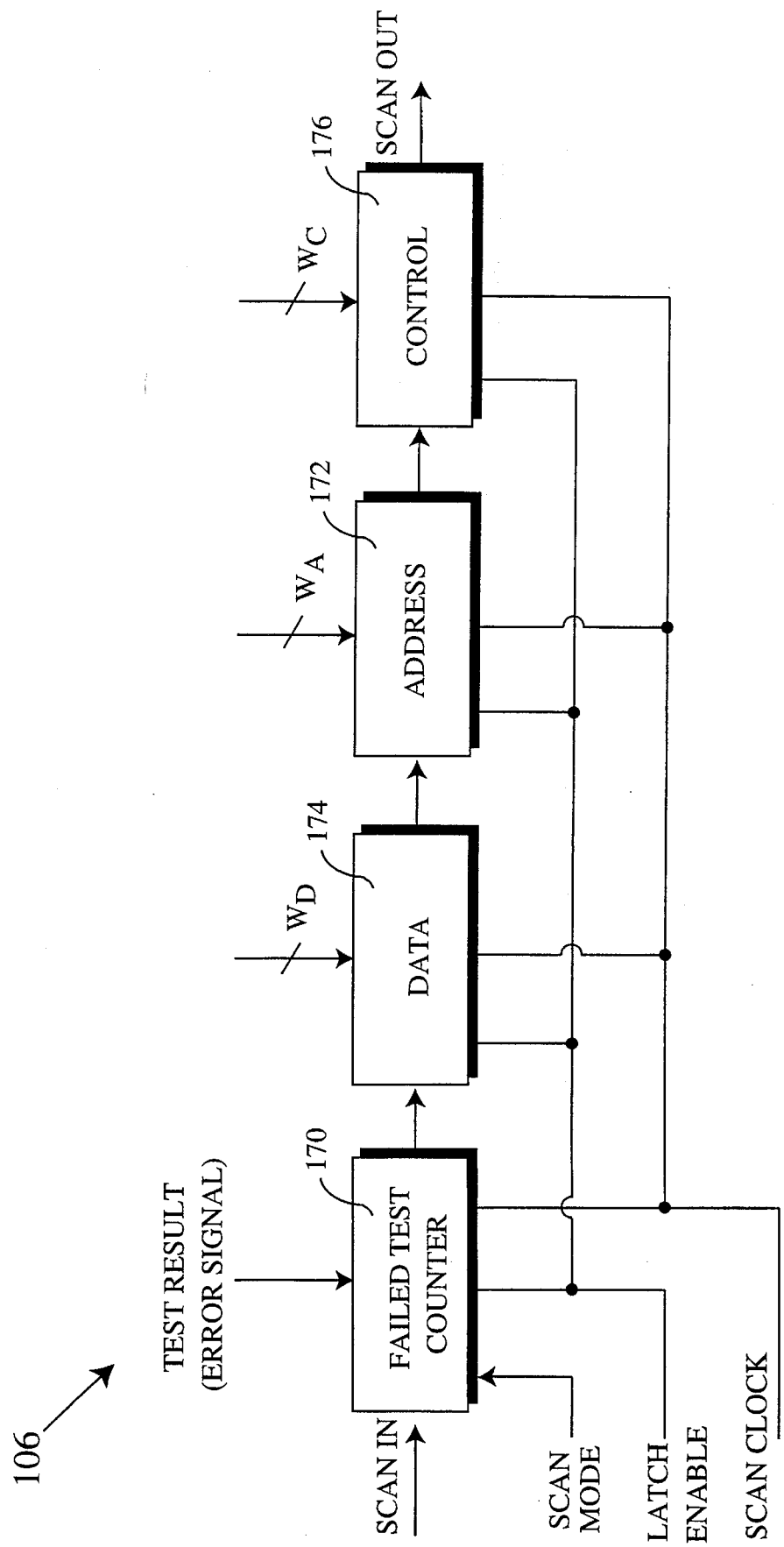
FIG. 7 is an embodiment of the BIST I/O shown as part of the BIST circuitry in FIG. 3.

Turning now to FIG. 7, a preferred embodiment of the BIST I/O 106 illustrated in FIG. 3 will be described in greater detail. Upon receipt of a scan mode enable signal, the "fail test counter" or "error counter register" 170 is loaded with initialization data. The initialization data is scanned in using the scan clock. During BIST testing of the RAM 84, a test result or error signal is transferred to the BIST I/O 106 from the comparator 104 and stored in the error register 170. When an error is detected while reading retrieved data from a selected address in the RAM 84, the address of the malfunction is stored in address register 172 under the command of the latch enable signal. In preferred embodiments, either test data or retrieved data may be stored in data register 174, and control information produced by the BIST may be latched in control register 176 under the control of the latch enable signal.

While information is latched into register 170 whenever an error occurs, the BIST 100 may be designed to latch addresses in register 172 either for every error occurrence or for a selected error such as the last error detected. Similarly, data register 174 and control register 176 may be updated for each error or for selected error. In addition, the contents in the register 170, 172, 174, and 176 may be scanned out in a scan chain for each error occurrence, a selected error occurrence, periodically, or only for the last error at the end of BIST testing. The scan out will be controlled by the scan clock.

In other preferred embodiments, the latching will be controlled by external vectors. Then the latch enable signal may be the output, for example, of an OR gate having the test result and an external latch line as inputs. With this configuration, a test engineer will run the BIST 100 in normal mode. If the RAM 84 passes the tests, then the error counter register 170 will contain zero, and the test result signal will stay "low" during all BIST testing. If the RAM 84 fails one or more write/read tests, the failed test counter 170 will hold the count of the failed tests, and the test result signal will pulse for each failing test.

From the test result signal on the BIST 100, the test engineer can determine the clock cycle number for each failing test. The clock cycle number when entered into a test vector generating program for the BIST 100 will generate a test vector file which will output the contents the address,- data, and control registers (signals) at the failing test locations through the TDO pin.

If the test engineer wants the retrieved data for all reads from RAM 84, a test vector file can be generated using the test vector generating program. Since the test clock and shift clock of the BIST are accessible from the test port, the test clock can be stopped after any or all Of the write/read tests permitting the latching of values of address, data, and control buses in latches or registers. Then, the contents of the latches or registers can be: scanned out through TDO using the scan (shift) clock. Subsequently, the test clock can be restarted and the process repeated. Data is automatically latched whenever the test result signal goes "high", or it can be latched using an external latch signal. Then, output of the registers is controlled by external test vector sequences. Memory data is shifted out through the TDO pin and can be formatted using a separate computer program cognizant of the memory and BIST configuration.

While this invention has been described in terms of several preferred embodiments, there are alterations, permutations, and equivalents which fall within the scope of this invention. It should also be noted that there are many alternative ways of implementing both the process and apparatus of the present invention. It is therefore intended that the following appended claims be interpreted as including all such alterations, permutations, and equivalents as fall within the true spirit and scope of the present invention.

What is claimed is:

1. An integrated circuit with read/write memory and read/write memory self testing capability comprising:

read/write memory having a plurality of data storage locations, each location having a unique address;

a controller responsive to a test enable signal and operative to generate and store test data at various locations in said read/write memory;

a comparator responsive to said test data provided by said controller and to retrieved data read from said read/write memory, said comparator comparing said test data and said retrieved data for corresponding locations in said read/write memory and producing error signals indicating that said retrieved data does not corresponds correctly to said test data; and input/output circuitry including at least one register capable of storing an address of a read/write memory location where an error has been detected as indicated by said error signals, and capable of outputting said address of a read/write memory location to provide an indication where said error occurred in said read/write memory.

2. An integrated circuit with read/write memory and read/write memory self testing capability comprising:

read/write memory having a plurality of data storage locations, each location having a unique address;

a controller responsive to a test enable signal and operative to generate and store test data at various locations in said read/write memory;

a comparator responsive to said test data provided by said controller and to retrieved data read from said read/write memory, said comparator comparing said test data and said retrieved data for corresponding locations in said read/write memory and producing error signals indicating that said retrieved data does not corresponds correctly to said test data; and input/output circuitry including at least one register capable of storing an address of a read/write memory location where an error has been detected as indicated by said error signals, and capable of outputting said address of a read/write memory location to provide an indication of where said error occurred in said read/write memory, and wherein said input/output circuitry includes a failed test counter which counts the error signals produced by said comparator.

3. An integrated circuit as recited in claim 1 wherein said input/output circuitry is controllable, at least in part, by one or more I/O command signals selected from the group consisting of a scan mode enable signal, a latch enable signal, and a shift clock signal.

4. An integrated circuit as recited in claim 3 wherein said input/output circuitry has a data register controllable, at least in part, by one or more of said I/O command signals.

5. An integrated circuit as recited in claim 3 wherein said input/output circuitry has an address register controllable, at least in part, by one or more of said I/O command signals.

6. An integrated circuit as recited in claim 3 wherein said input/output circuitry has a control register controllable, at least in part, by one or more of said I/O command signals, 7. An integrated circuit as recited in claim 1 wherein said comparator includes a number of XOR gates corresponding to a number of bits of a data storage location, wherein each XOR gate compares a bit of said retrieved data against a corresponding bit of said test data.

8. An integrated circuit: as recited in claim 7 wherein outputs of said plurality of XOR gates are coupled to inputs of an OR gate such that an output of said OR gate provides said error signals.

9. An integrated circuit comprising:

random access memory (RAM) comprising a plurality of data storage locations each having a unique address; and a built-in self tester coupled to said RAM and to a plurality of input/output (I/O) ports of said integrated circuit, said tester including:

(a) a RAM BIST controller for controlling said RAM during a test, said RAM including data, address, and control lines;

(b) a comparator responsive to outputs of said RAM BIST controller and said RAM and operative to develop an error signal; and (c) BIST I/O responsive to outputs of said comparator and having at least one output coupled to at least one of said I/O ports, said BIST I/O including at least one register capable of storing at least one address of a data storage location in said RAM that malfunctioned during said test, said BIST I/O being further capable of outputting said at least one address via said at least one I/O port.

10. An integrated circuit as recited in claim 9 wherein said RAM BIST controller includes an address generator to specify addresses in said RAM, a control signal generator specifying operations to be performed with said RAM and test data for said RAM, and initialization logic which generates initialization signals to reset the address generator and the control signal generator in response to a test reset signal received by the BIST.

11. An integrated circuit its recited in claim 10 wherein said RAM BIST controller further comprises switching logic which, in response to said initialization signals, decouples said BIST and said RAM from other components on said integrated circuit and couples said BIST RAM controller to said RAM.

12. An integrated circuit as recited in claim 9 wherein said comparator includes combinational logic which compares data stored at a selected storage location in said RAM with data that was written to said selected storage location.

13. An integrated circuit as recited in claim 9 wherein said BIST I/O is further capable of storing data that was stored in said address of said data storage location in said RAM that failed during said test.

14. An integrated circuit as recited in claim 13 wherein said BIST I/O is further capable of storing a number corresponding to the total number of data storage locations in said RAM that failed during said test.

15. An integrated circuit as recited in claim 14 wherein said BIST I/O comprises:

an error register coupled to said error signal of said comparator;

a data register coupled data lines of said RAM;

an address register coupled to address lines of said RAM; and a control register coupled to control lines of said RAM.

16. An integrated circuit, as recited in claim 15 wherein said error register, said data register, said address register, and said control register, are responsive to a scan-out signal and a shift clock signal, such that data in said registers may be scanned out of said at least one I/O port.

17. An integrated circuit as recited in claim 15 wherein said error register, said data register, said address register, and said control register, are responsive to a latch enable signal to command said error register to store said number, said data register to store said data, said address register to store said at least one address, and said control register to store control signals sent by said BIST RAM controller to said RAM during said test.

18. A method of testing memory on an integrated circuit comprising:

activating at least one read/write memory location on said integrated circuit, said memory location having an address; and activating a built-in self tester on said integrated circuit to:
   (a) write test data to said memory location;
   (b) read said test data as retrieved data from said memory location;
   (c) compare said test data with said retrieved data and developing an error signal when said retrieved data does not correctly correspond to said test data;
   (d) store in an error address register said address of said memory location in response to said error signal; and
   (e) outputting contents Of said error address register in response to an output command received by said built in self tester.

19. A method as recited in 18 wherein further comprising the step of repeating steps (a) (d) a plurality of times for a plurality of memory locations.

20. A method as recited in claim 18 further comprising a step of storing said retrieved data in an error data register in response to said error signal, and wherein step (e) further comprises outputting contents of said error data register with said contents of said error address register.

21. A method as recited in claim 20 further comprising a step of storing control data in an error control register in response to said error signal, and wherein step (e) further comprises outputting contents of said error control register with said contents of said error address register and said error data register.

22. A method as recited in claim 19 further comprising the step of counting the number of error signals produced by step (c) during said plurality of times.

* * * * *